United States Patent [19]
Salem et al.

[11] Patent Number: 5,841,790
[45] Date of Patent: Nov. 24, 1998

[54] APPARATUS FOR TESTING AN ADAPTER CARD ASIC WITH RECONFIGURABLE LOGIC

[75] Inventors: Gerard M. Salem, Essex Junction, Vt.; Robert J. Lynch, Raleigh, N.C.

[73] Assignee: International Business Machines Corporation, Armonk, N.Y.

[21] Appl. No.: 831,542

[22] Filed: Apr. 8, 1997

[51] Int. Cl.⁶ .................................................. G01R 31/28
[52] U.S. Cl. ........................ 371/22.1; 371/22.5; 371/22.6
[58] Field of Search ................................ 371/22.1, 22.2, 371/22.31, 22.32, 22.4, 22.5, 22.6; 395/183.06

[56] References Cited

U.S. PATENT DOCUMENTS

| | | | |
|---|---|---|---|
| 4,312,066 | 1/1982 | Bantz et al. ............................. | 371/16 |
| 4,513,418 | 4/1985 | Bardell, Jr. et al. ..................... | 371/25 |
| 4,760,575 | 7/1988 | Watanabe ............................... | 371/25.1 |
| 4,764,926 | 8/1988 | Knight et al. ........................... | 371/25 |
| 4,817,093 | 3/1989 | Jacobs et al. ........................... | 371/25 |
| 4,860,290 | 8/1989 | Daniels et al. .......................... | 371/25 |
| 4,930,129 | 5/1990 | Takahira ................................ | 371/40.4 |
| 5,173,904 | 12/1992 | Daniels et al. ......................... | 371/22.3 |
| 5,233,612 | 8/1993 | Huyskens et al. ...................... | 371/16.2 |
| 5,237,690 | 8/1993 | Bealkowski et al. ................... | 395/700 |
| 5,381,420 | 1/1995 | Henry .................................... | 371/22.3 |
| 5,404,359 | 4/1995 | Gillenwater et al. ................... | 371/22.5 |
| 5,416,783 | 5/1995 | Broseghini et al. .................... | 371/22.3 |
| 5,485,467 | 1/1996 | Golnabi ................................. | 371/22.5 |
| 5,515,382 | 5/1996 | Lassorie ................................ | 371/22.3 |

*Primary Examiner*—Hoa T. Nguyen
*Attorney, Agent, or Firm*—Floyd A. Gonzalez; Heslin & Rothenberg

[57] ABSTRACT

An adapter card in a computer system includes an application specific integrated circuit (ASIC) and a field programmable gate array (FPGA) coupled to the ASIC. Random data is provided to the ASIC logic function(s) by control of the FPGA, which is configured by a programmable logic device on the card and coupled thereto. The logic function(s) of the ASIC is then exercised with the random data, and the output is compared with expected output by the system to determine if there are any errors. The determination is made based on a signature produced by a multiple input shift register (MISR) within the ASIC, based on the output data from the logic function(s). The FPGA can then be reconfigured for normal adapter card functions.

12 Claims, 12 Drawing Sheets

APPARATUS FOR TESTING AN ADAPTER CARD ASIC WITH RECONFIGURABLE LOGIC

BACKGROUND OF THE INVENTION

1. Technical Field

The present invention generally relates to integrated circuit testing. More particularly, the present invention relates to testing an application specific integrated circuit (ASIC) while on an adapter card.

2. Background Information

In the past, scan and self-test functions (as well as debug) for application specific integrated circuits (ASICs) were largely performed by either state machines internal to the ASIC upon power on and/or by the use of external diagnostic tools. One problem with internal state machines in ASICs that perform self-test upon power on is that the ASIC must complete self-test and become "live" in order to check the signature (result of the test), or the signature must be scanned externally to be verified. Such a scan often requires a service processor. Another problem with internal state machines is that they add risk, time, cost and complexity to ASIC designs.

Scanning is also used for functional debugging. After an error condition arises, scanning the ASIC with an external diagnostic tool provides useful information about the state of the registers at the time of the error that can be used for analysis and correction of the problem. Often, an external service processor is used in the case of debugging. However, the failing system then needs to have an external device attached to it to log and analyze data, which may not be practical for a field problem or a problem which is not easily reproducible.

Thus, a need exists for a way to perform scan and self-test functions for ASICs without relying on "live" operation of the ASIC or external diagnostic tools.

SUMMARY OF THE INVENTION

Briefly, the present invention satisfies the need for a way to perform scan and self-test functions on ASICs by providing programmable or configurable logic residing on the same adapter card as the ASIC to control the scanning and exercise the ASIC logic, and which can also be reconfigured for normal adapter card functions.

In accordance with the above, it is an object of the present invention to provide a way to scan and test ASICs without relying on the proper functioning of the ASIC itself, or on diagnostic tools external to the adapter card on which the ASIC resides.

The present invention provides an apparatus for testing an application specific integrated circuit (ASIC) on an adapter card in a computer system, the ASIC having at least one logic function. The apparatus comprises reconfigurable logic coupled to the ASIC and residing on the adapter card for causing data to be provided to the ASIC, means residing on the adapter card for operating on the data with the at least one logic function to produce output data, and means for determining whether there are any errors in the output data. The reconfigurable logic is reconfigurable to perform one or more post-testing adapter card functions.

These, and other objects, features and advantages of this invention will become apparent from the following detailed description of the various aspects of the invention taken in conjunction with the accompanying drawings.

BEST MODE FOR CARRYING OUT THE INVENTION

Figure 1:
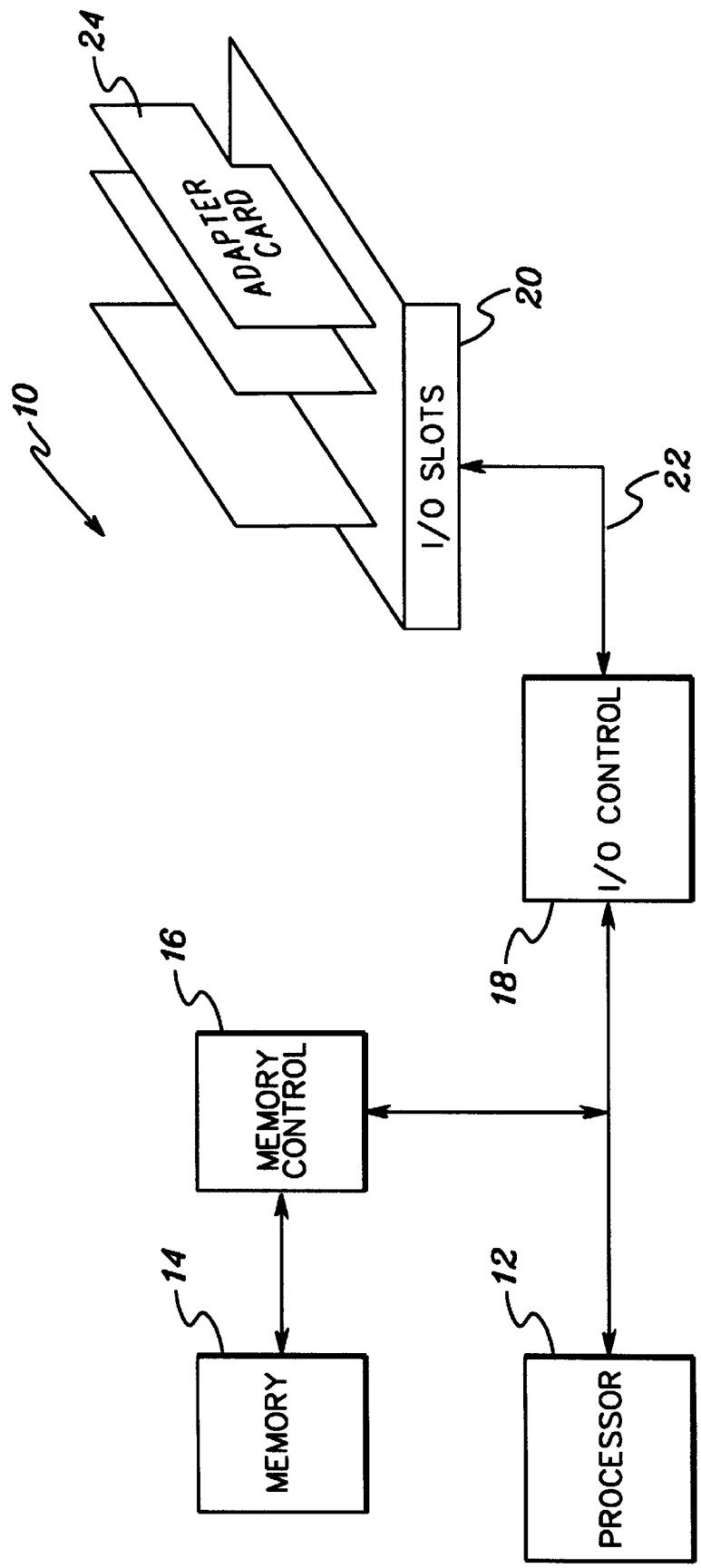
FIG. 1 is block diagram of a computer system in accordance with the present invention.

FIG. 1 is a high-level block diagram of a computer system 10 in which the present invention is included. System 10 comprises a processor 12, memory 14, memory control 16, I/O control 18, I/O slots 20, I/O bus 22, and a plurality of adapter cards in the I/O slots, such as adapter card 24. One skilled in the art will understand the general operation of system 10.

Figure 2:
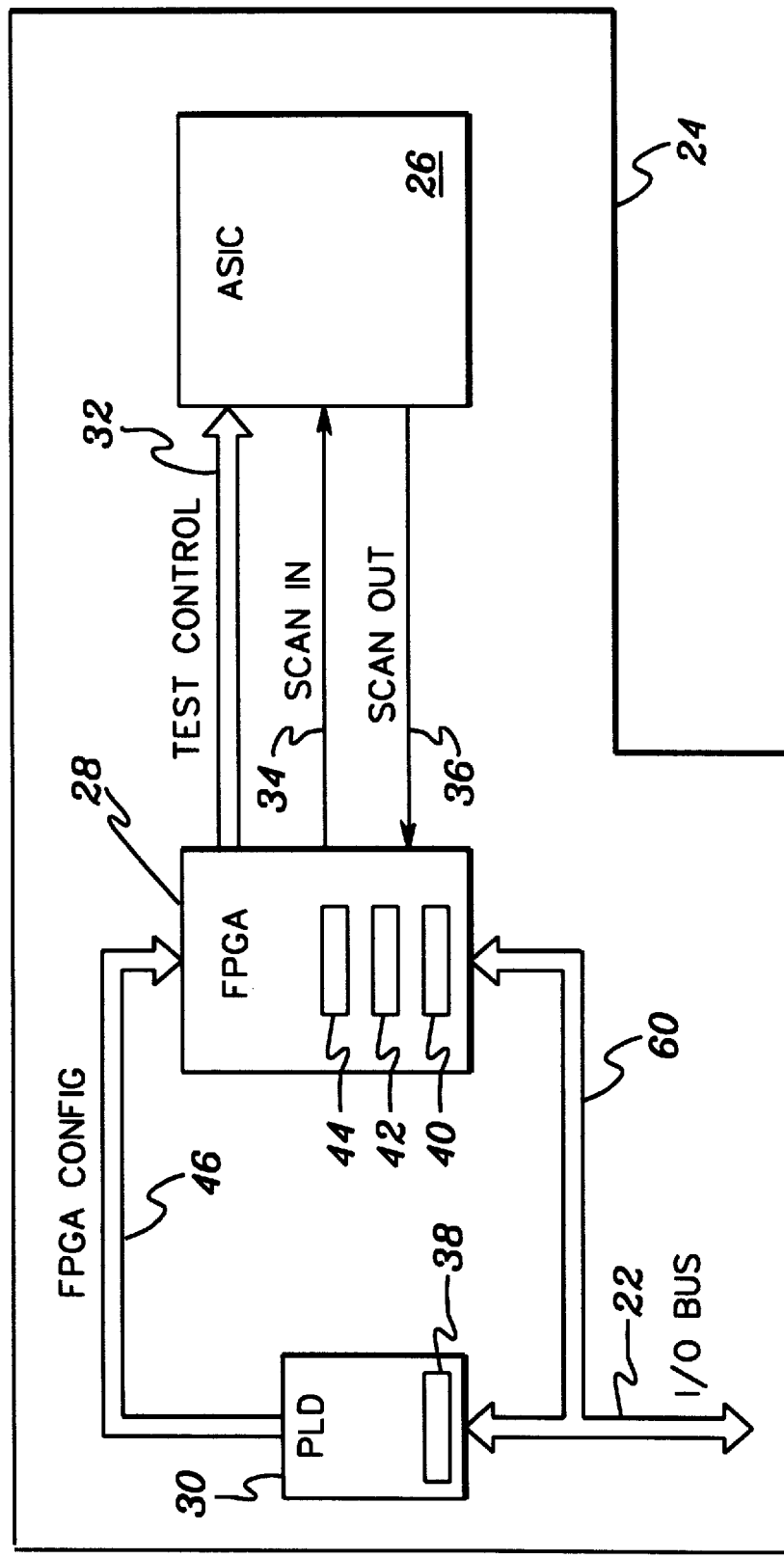
FIG. 2 is a more detailed block diagram of an adapter card in the computer system of FIG. 1.

FIG. 2 is a more detailed block diagram of the adapter card 24 from FIG. 1. Adapter card 24 comprises an application specific integrated circuit (ASIC) 26, a field programmable gate array (FPGA) 28, and program logic device (PLD) 30, such as, for example, gate array logic. The PLD 30 communicates with the system over I/O bus 22 from FIG. 1. As shown, the system can also communicate directly with FPGA 28 via I/O bus 22. Test controls are sent from FPGA 28 to ASIC 26 over line 32. Data is scanned into ASIC 26 over line 34, and scanned out of ASIC 26 over line 36. PLD 30 and FPGA 28 each contain one or more programmable options select (POS) registers 38 and 40, respectively. FPGA 28 also comprises a scan state machine 42 and a self-test state machine 44.

The POS registers 38 in PLD 30 have two functions. First, they provide an adapter card identification to the system over I/O bus 22. Second, POS registers 38 load the FPGA logic configuration into FPGA 28 over line 46. As one skilled in the art will know, the configuration loaded into FPGA 28 is lost on power down. After FPGA 28 is loaded with the logic configuration, the system control software can communicate directly with it via I/O bus 22. Generally, the configuration of a communications adapter card is described in U.S. Pat. No. 5,237,690, issued to Bealkowski et al. on Aug. 17, 1993, and entitled "System for Testing Adapter Card upon Power Up and Having Disablement, Enablement, and Reconfiguration Options." Bealkowski et al. is herein incorporated by reference in its entirety. The Bealkowski patent also describes in greater detail the POS registers.

Although the POS registers are specific to the microchannel architecture, which one skilled in the art will recognize, the present invention applies to any I/O bus architecture with configurable registers.

Although the present exemplary embodiment includes an FPGA, it will be understood that other logic could be used, so long as it is reconfigurable.

Figure 3:
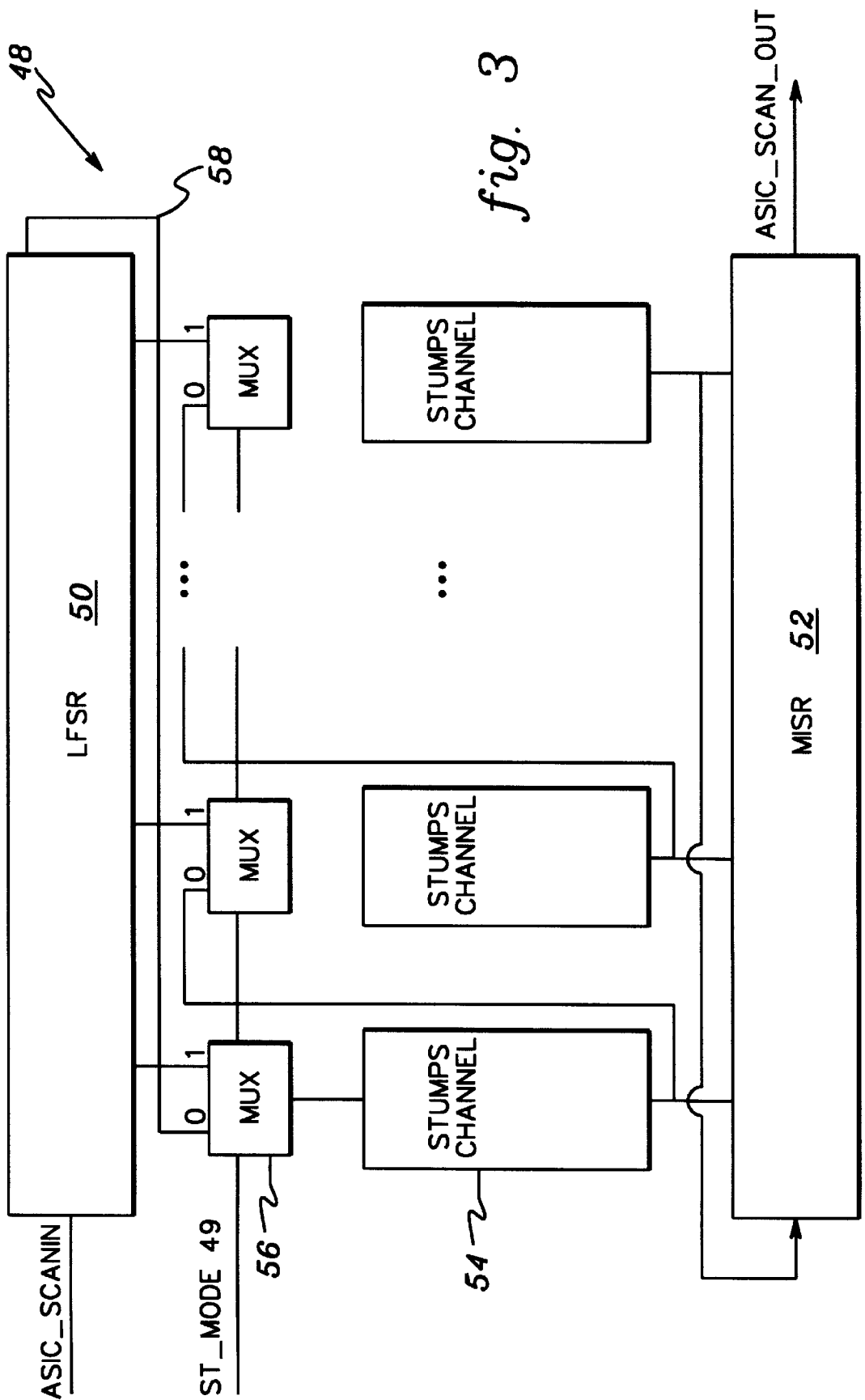
FIG. 3 is a block diagram of a shift register logic configuration on the ASIC of FIG. 2.

FIG. 3 is a block diagram of a shift register logic configuration (SRL) 48 on ASIC 26. U.S. Pat. No. 4,513,418, issued to Bardell, Jr. et al. on Apr. 23, 1985, and entitled "Simultaneous Self-Testing System" describes an ASIC for a communications adapter and control therefor. The Bardell, Jr. et al. patent is herein incorporated by reference in its entirety. SRL 48 supports logic built-in self test for the ASIC, and comprises linear feedback shift register (LFSR) 50, multiple input shift register (MISR) 52, a plurality of stumps channels (e.g., stumps channel 54), each stumps channel including one or more shift register latches, and a plurality of multiplexers, one for each of the stumps channels (e.g., multiplexer 56). One skilled in the art will understand the operation of SRL 48, however, a brief overview will now be given.

The shift register latches (or "registers") within the stumps channels normally perform the ASIC logic function(s). In order to test the ASIC logic function(s), it is necessary to configure the stumps channels of SRL 48 into a long chain, serially sending data therethrough. When the self-test mode signal 49 (hereinafter "ST_MODE") provided by the FPGA and programmable through POS registers 40 is low, serially shifted data is passed from LFSR 50 over line 58 to multiplexer 56 and out into the stumps channel chain, beginning with stumps channel 54. Eventually, the data is shifted into MISR 52. The preceding description will be referred to as "scan mode."

When $ST_{\_MODE}=1$, ASIC 26 has entered "self-test" mode, and the input to all of the multiplexers comes directly from LFSR 50, rather than being received serially from the previous stumps channel. In self-test mode, data (in this case, random data) is passed from LFSR 50 to the stumps channels. Depending on the number of registers n in the largest stumps channel, n scan clock pulses flush the random data through the stumps channels to the ASIC logic to test it. When the stumps channels are loaded with data, a system clock pair is provided, exercising and testing the ASIC logic function(s). The results are fed back into the stumps channels and into MISR 52 for signature formation and eventual comparison with expected results. Preferably, the data used to test the ASIC logic is random, however, it need not be. Additional details regarding the general operation of the SRL can be found in the Bardell, Jr. et al. patent.

Figure 4:
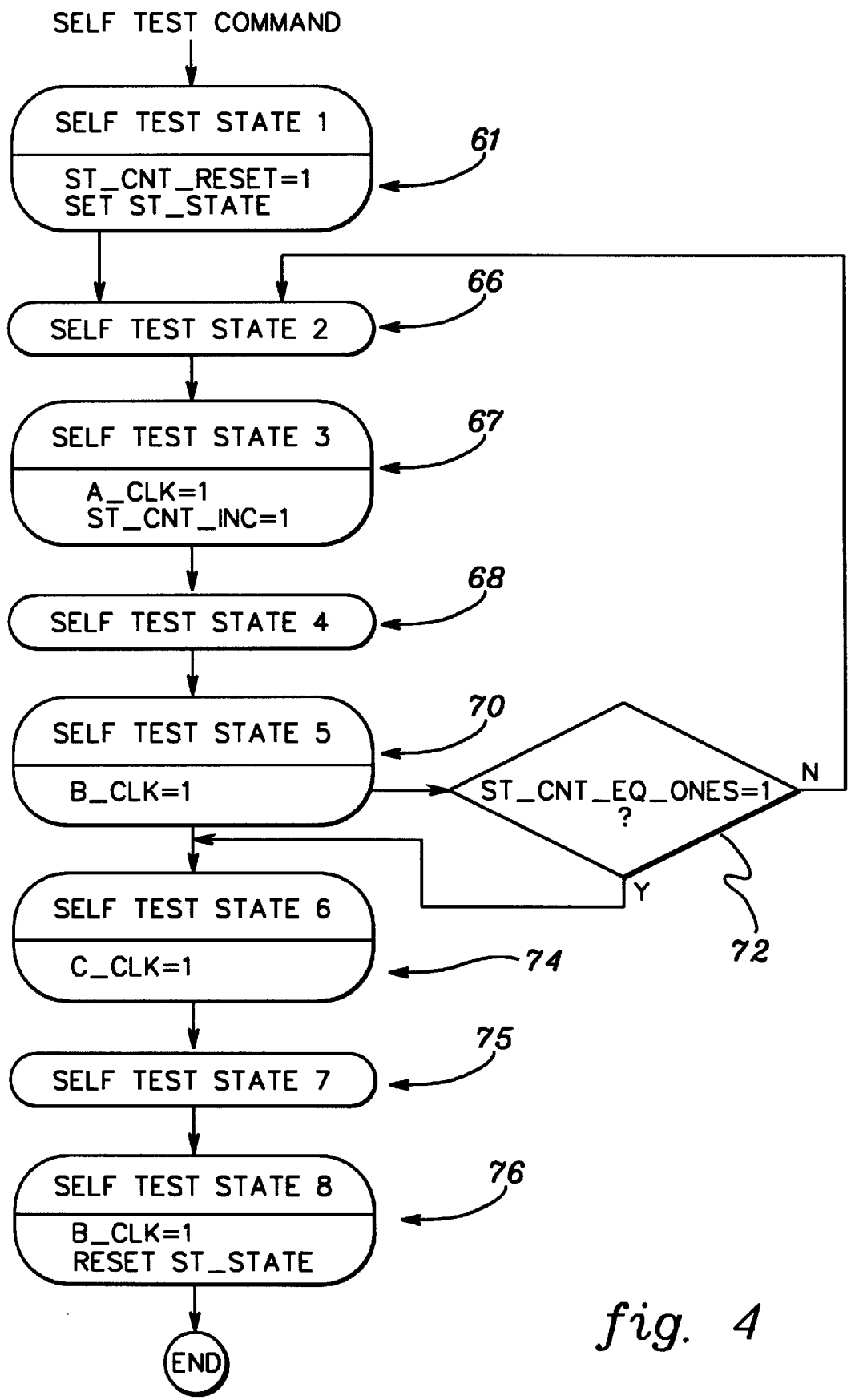
FIG. 4 is a state/flow diagram for the self-test state machine in the FPGA of FIG. 2.
Figure 5:
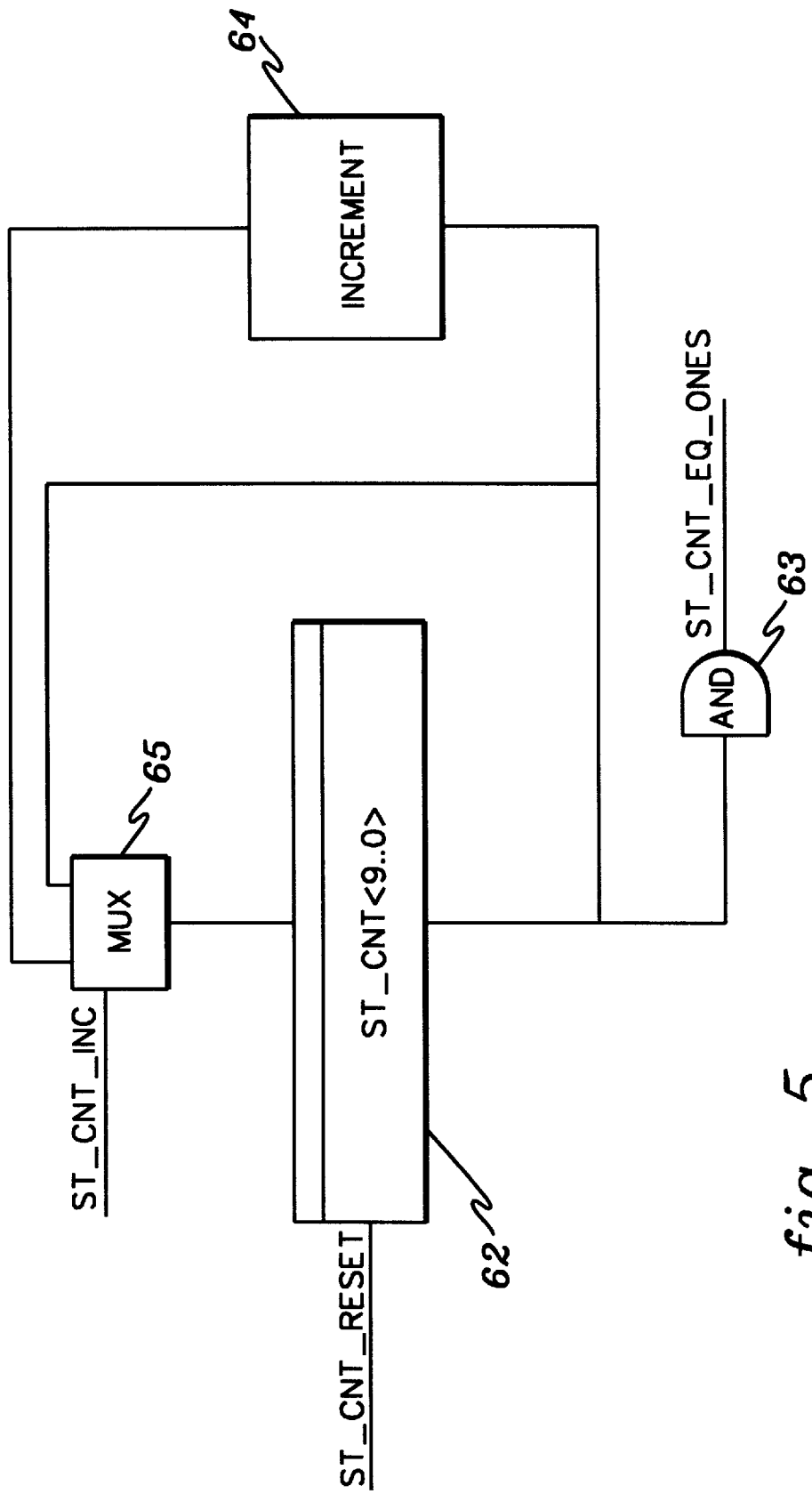
FIG. 5 depicts logic within the FPGA of FIG. 2 used by the self-test state machine, the state/flow diagram for which is shown in FIG. 4.

FIG. 4 is a state/flow diagram for the self-test state machine 44 in FPGA 28 of FIG. 2. Both the self-test and scan state machines are logic, implemented in an FPGA, that takes commands from the system over the I/O bus and issues the proper test clock sequences. Assume that FPGA 28 includes three clock signals for scanning and self-test: ACLK; BCLK; and CCLK. Assume further that in the present exemplary embodiment, the self-test state machine requires an ACLK/BCLK pair for scanning during self-test mode and a BCLK/CCLK pair to test the ASIC logic function(s). The self-test state machine will be described with reference to FIG. 5, showing a counter 62 and other related logic present in FPGA 28. Counter 62 is a ten-bit counter, and is shown along with AND gate 63, incrementor 64 and multiplexer 65. Counter 62 counts to $2_n$, where "n" is the number of bits in the counter, and must be larger than the stumps channel with the most registers.

Figure 12:
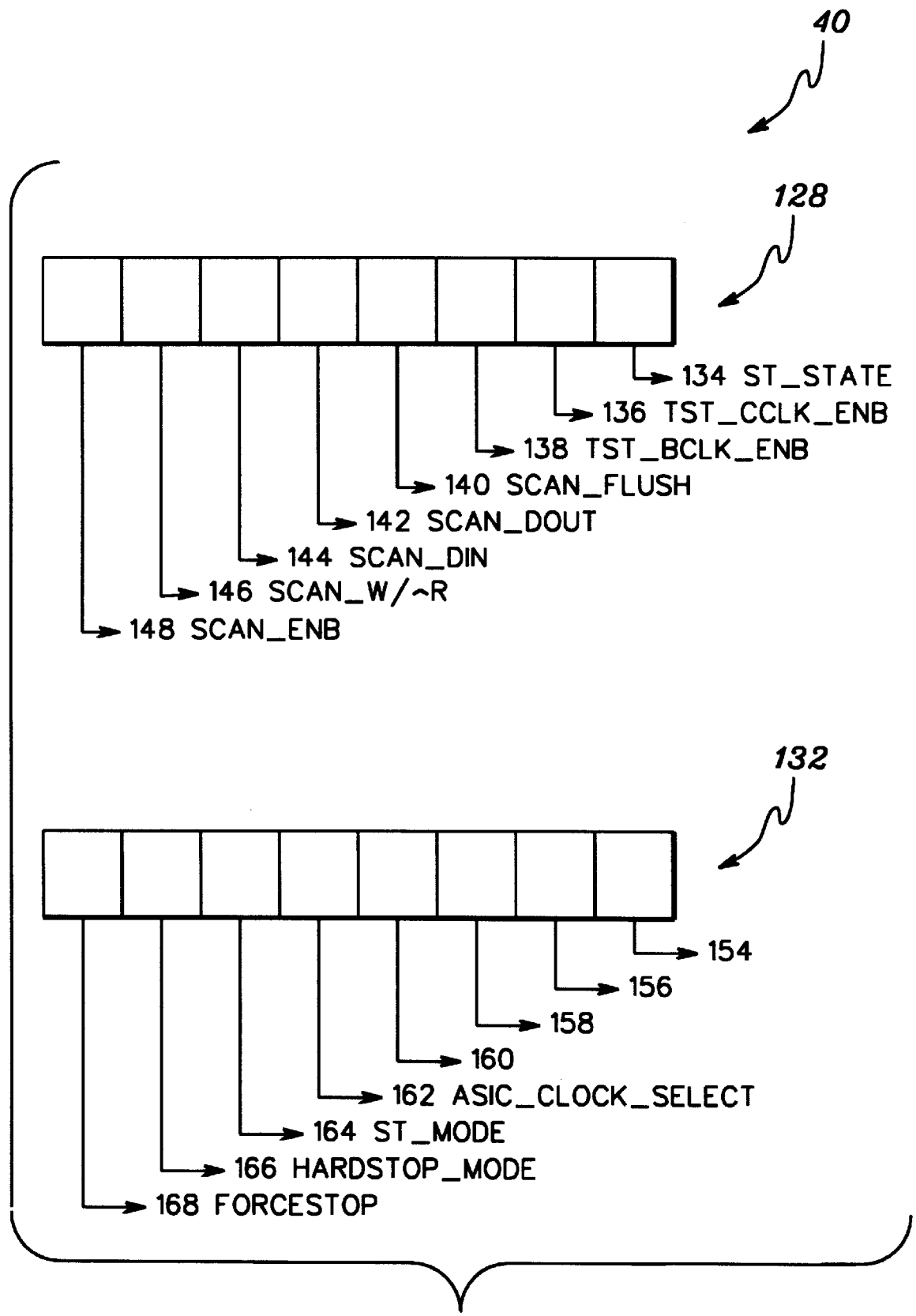
FIG. 12 depicts program options select registers from the FPGA of FIG. 2.

Returning now to FIG. 4, the self-test state mode is entered in state 61 when the system writes to the relevant FPGA POS register bit (bit 134 in FIG. 12). More specifically, the relevant bit of the POS registers 40 of FPGA 28 is written to by the system via I/O bus 22 over line 60, which causes initiation of the self-test state machine, indicated by the ST_STATE signal going high. As one skilled in the art will understand, the states in the state/flow diagram indicate clock states, with each state taking place in successive clock cycles. Also during state 61, the self-test state machine sets the signal (ST_CNT_RESET) for resetting counter 62 high, allowing the increment signal from incrementor 64 through. Nothing substantive happens during states 66, 68 and 75. During state 67, the ACLK is pulsed by the self test state machine, and the signal for incrementing counter 62 (ST_CNT_INC) is raised. During state 70, the BCLK is pulsed, and an inquiry is made as to whether counter 62 has counted out (Inquiry 72, "ST_CNT_EQ_ONE=1?"). If counter 62 has not counted out, the state machine returns to State 66. Once counter 62 counts out, the CCLK is raised during state 74. The BCLK is again raised during state 76 and the ST_STATE signal is lowered to idle the self-test state machine.

Figure 6:
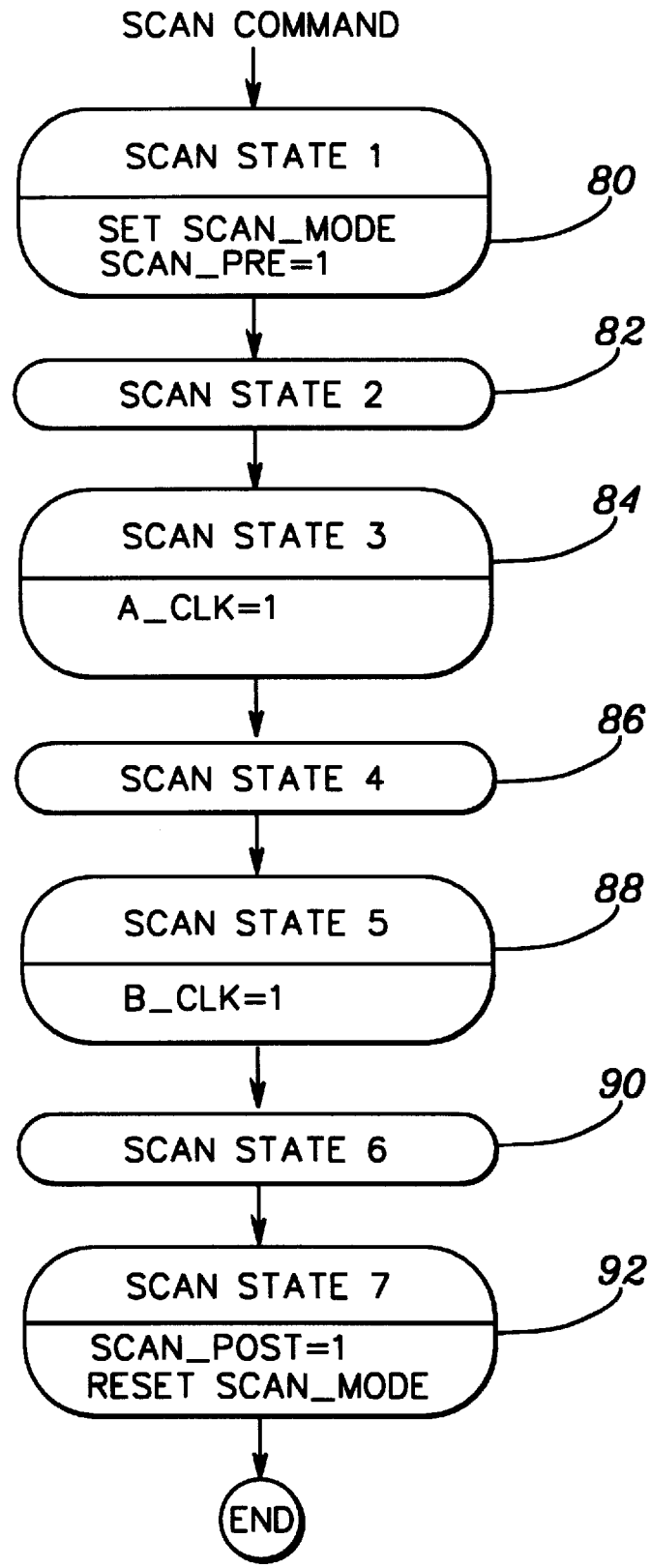
FIG. 6 is a state/flow diagram for the scan state machine within the FPGA of FIG. 2.

FIG. 6 is state/flow diagram for the scan state machine 42 of FIG. 2. When the system puts the ASIC into scan mode during state 80 by raising a SCAN_MODE signal (via POS registers 40), the scan state machine is implemented. Also during state 80, a signal for allowing the data going into the ASIC to be altered (scan_pre) is raised. During state 84, the ACLK is raised. Similarly, during state 88, the BCLK is raised, providing the ACLK/BCLK pair needed for scanning. Finally, during state 92, the SCAN_MODE signal is lowered, and a signal for allowing old ASIC data to be put back into the ASIC (scan_post) is raised. Nothing substantive happens during states 82, 86 and 90.

Figure 7:
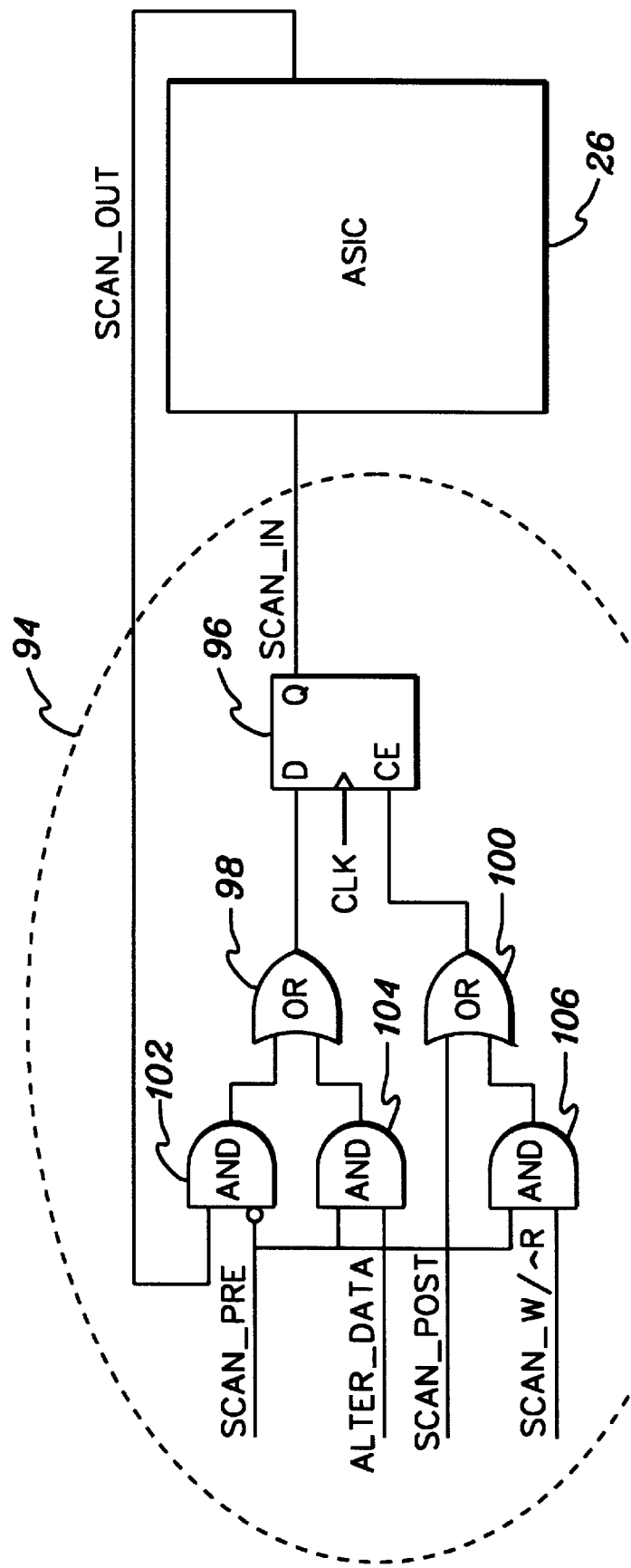
FIG. 7 depicts a scan data path, including the ASIC and relevant logic of the FPGA of FIG. 2.

FIG. 7 depicts the scan data path including ASIC 26 and a portion 94 of FPGA 28 from FIG. 2. Portion 94 comprises logic elements, including flip-flop 96, OR gates 98 and 100, and gates 102, 104 and 106. The inputs to AND gate 102 are the output of ASIC 26 and a signal (scan_pre) from the scan state machine issued during state 80 in FIG. 6. The inputs to AND gate 104 are the scan_pre signal from the scan state machine and a signal from POS registers 40 (alter_data) regarding writing data into the scan chain of FIG. 3 (see description of bit 144 in POS register 128 of FIG. 12). The inputs to AND gate 106 are the scan_pre signal and the scan write/read^signal from POS registers 40 in FPGA 28 (the POS registers of the FPGA will be discussed in more detail below). The inputs to OR gate 98 are the outputs of AND gates 102 and 104. The inputs to OR gate 100 are the scan_post signal issued by the scan state machine during state 92 and the output of AND array 106. The inputs to flip-flop 96 are an FPGA functional clock signal "clk" and the outputs of OR array 98 and OR array 100. Finally, the output of flip-flop 96 is the input to ASIC 26.

Figure 8:
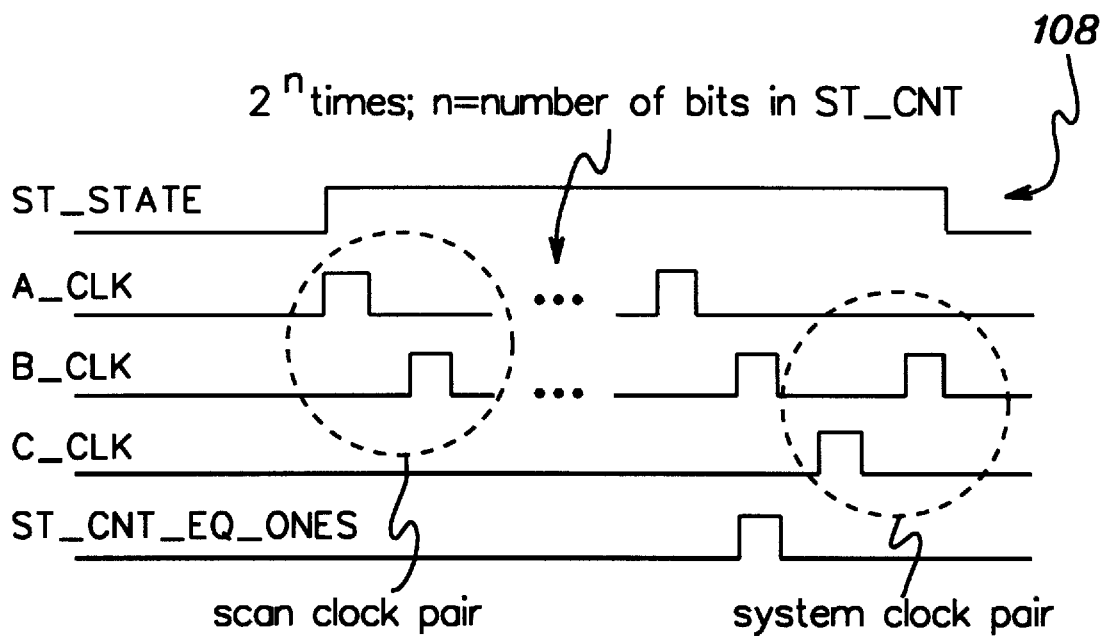
FIG. 8 is a timing diagram for the self-test state machine of FIG. 2.
Figure 9:
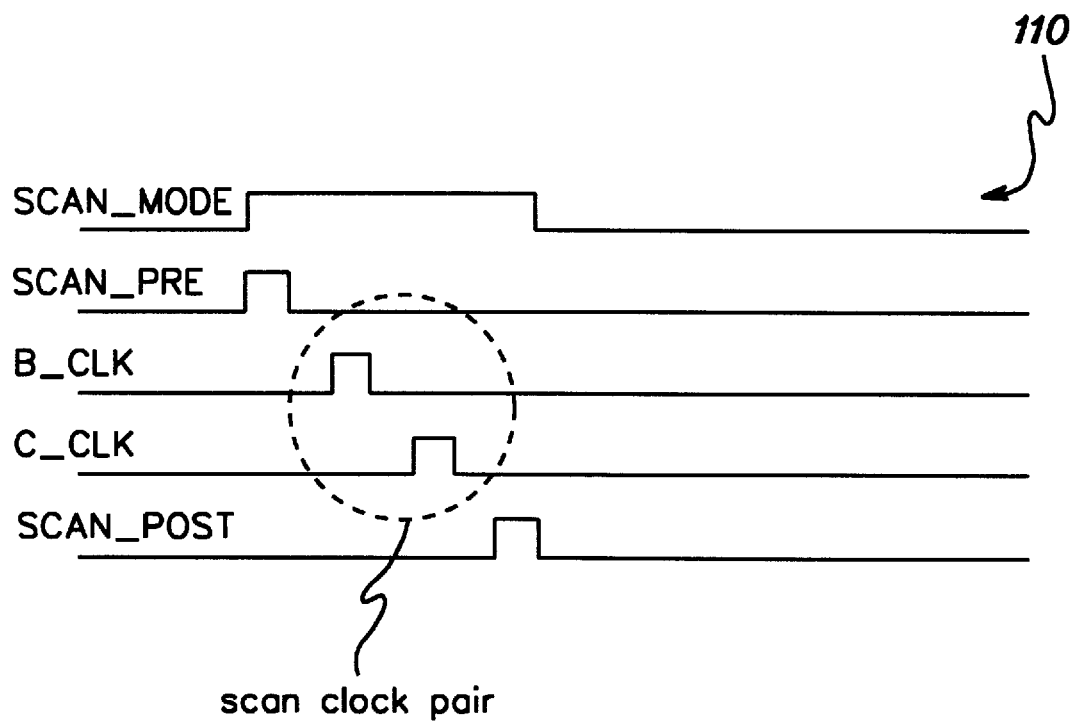
FIG. 9 is a timing diagram for the scan state machine of FIG. 2.

FIG. 8 is a timing diagram 108 for the self-test state machine 44 of FIG. 2, the timing diagram tracking the events in the state/flow diagram of FIG. 4. Similarly, FIG. 9 is a timing diagram 110 for scan state machine 42 of FIG. 2, the scan state machine timing diagram tracking the events in the state/flow diagram of FIG. 6.

Figure 10:
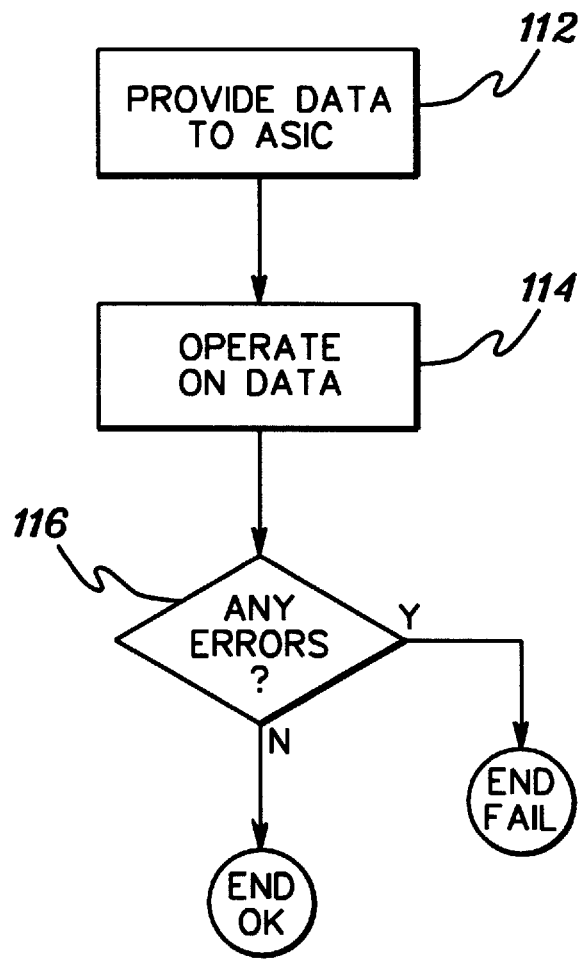
FIG. 10 is a flow diagram for the method of the present invention.

FIG. 10 is a flow diagram for the overall method of the present invention. On a high level, based on test controls from FPGA 28 (one example of reconfigurable logic) to ASIC 26 over line 32, test data is provided to the ASIC, such as described with respect to FIG. 3 (Step 112, "PROVIDE DATA TO ASIC"). The test data is then operated on within the ASIC to exercise the one or more logic functions of the ASIC (Step 114, "OPERATE ON DATA"). Finally, a determination is made as to whether the output data from the ASIC contains any errors (Inquiry 116, "ANY ERRORS?"). Software outside adapter card 24 determines whether there are any errors by comparing the signature provided by MISR 52 to what the signature should be. If there are any errors, then the test has failed. If the error occurs during initialization, software outside the adapter card would detect an error and raise an error condition regarding that card, e.g., on a display. If the failure occurs during manufacturing testing, the card would be rejected. In addition, the results of the test might be used to diagnose the problem with ASIC 26. If there are no errors, then the test is complete.

Figure 11:
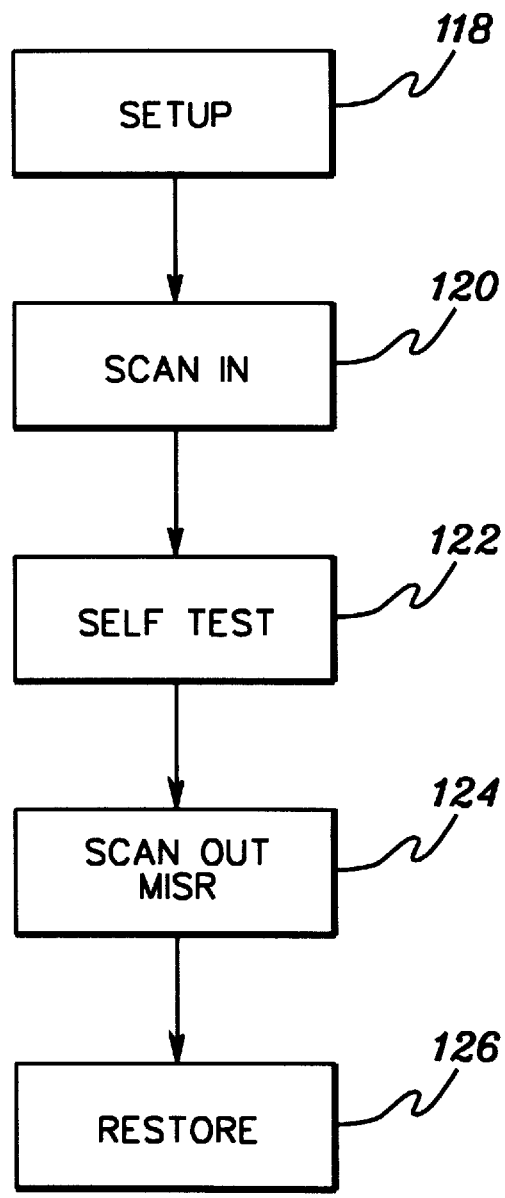
FIG. 11 is a more detailed flow diagram for one embodiment of the method of the present invention.

FIG. 11 is a more detailed flow diagram for the steps of the flow diagram of FIG. 10. As previously described with respect to FIG. 3, random data is provided to the ASIC registers for subsequent exercising of the ASIC function(s) by LFSR 50. However, before the ASIC registers can be written to, any necessary setup needs to be done. For example, the clocks for FPGA 28 might need to be cleanly stopped (Step 118, "SETUP"). After setup, scan-in of the ASIC registers can take place (Step 120, "SCAN IN"). For each register on the ASIC, a different scan command is issued. In other words, the scan-in procedure is where the stumps channels are configured in a chain and filled with known values (see previous (discussion with respect to FIG. 3). After scan-in, ASIC self testing is initiated by the self-test state machine 44 (Step 122, "SELF-TEST"). The self-test procedure includes the LFSR directly inputting data (here, random data) into the stumps channels (see previous discussion of FIG. 3). With each ACLK/BCLK pair, another register in the stumps channels is filled with random data. A BCLK/CCLK pair exercises the ASIC logic function(s). Self test 122 is preferably repeated as many times as possible; the more it is done, the more ASIC logic that is tested. After self-test, the output data from the ASIC logic is put back in the stumps registers, run through the MISR, and the MISR signature is scanned out (Step 124, "SCAN OUT MISR"). The scanning of the MISR is part of the determining step (Step 116) of FIG. 10. At this point, the data is available at FPGA 28 to the system over I/O bus 22. The conditions existing before setup are then restored (Step 126, "RESTORE"). For example, if the clocks were cleanly stopped in Step 118, the clocks would be restarted. In the present exemplary system, the clocks are stopped and started only on the first scan.

FIG. 12 depicts relevant POS registers 40 in FPGA 28. The POS registers include register 128 for scan and self-test controls, and register 132 for miscellaneous controls. A description of the relevant bits of each of the POS registers will now be given. The first bit 134 of register 128 when set to 1, enables the self-test mode. When a self-test sequence is completed, this bit will be reset to zero. Bits 136 and 138 of register 128 are used to put the BCLK and CCLK into test mode. When these bits are set to 1, the BCLK and CCLK are controlled by the scan and self-test state machines. Logic in the scan and self-test state machines prevents the BCLK and CCLK from being active simultaneously. When bits 136 and 138 are zero, the BCLK and CCLK are inactive. Bit 140 of register 128 is used to "flush"data into the stumps channel chain for initialization. Bit 142 of register 128 is the data port used for scan read operations. Bit 144 of register 128 is a data port used for scan write operations. Bit 146 of register 128 is a write/read^bit, where "^" indicates "not" and when it is a 1, data will be taken from data port 144. This data is used to alter the contents of a register. See the FIG. 7 discussion. If bit 146 is zero, the data scanned is what was scanned out on the previous scan operation. Bit 148 of register 128 enables the scan mode. When bit 148 is set to 1, read requests to register 128 will cause data to be scanned through the stumps channel chain.

Bits 154–160 of register 132 relate to miscellaneous controls not necessary for an understanding of the present invention. Bit 162 of register 132 is the ASIC clock select, and when set to 1 gates test clocks BCLK and CCLK to the serial register latches of ASIC 26. When set to zero, bit 162 gates the system clock to the ASIC registers. This bit must be set before scanning or self test can take place. Before setting this bit, the ASIC clocks should be stopped. Bit 164 of register 132 relates to scanning and self test (the ST_MODE signal). When scanning, this bit is set to a 0, and during self test, this bit is set to a 1. Bit 166 of register 132 causes a hard stop to the ASIC clocks cleanly upon an error condition, in order to scan. Finally, bit 168 of register 132 causes a clean stop of the ASIC clocks immediately.

The preferred programming of POS registers 40 is shown below. However, it will be understood that other programming approaches are possible to accomplish the same objectives.

Setup Procedure
1. write bit 168=1 (forced clock stop);
2. write bit 162=1 (select test clocks);
3. write bit 164=0 (enter scan mode);
4. write bit 136=1 (raise CCLK); and
5. write bit 138=1 (raise BCLK).

Read Scan Procedure (for ASIC registers)
1. write bit 146=0 (read scan);
2. write bit 148=1 (enable scan state machine);
3. read bit 142 (read scan data port); and
4. repeat step 3 for n−1 more times, where n is the number of registers in the stumps channel scan chain.

Write Scan Procedure (for ASIC registers)
1. write bit 146=1 (write scan);
2. write bit 148=1 (enable scan state machine);
3. write bit 144=X, where X is the value to be written to the corresponding register in the stumps channel scan chain; and
4. repeat step 3 for n−1 more times, where n is the number of registers in the stumps channel scan chain.

Self-test Procedure
1. write bit 164=1 (enter self-test mode);
2. write bit 134=1 (enable self-test state machine);
3. read bit 134; when it is off, one self-test sequence has completed;
4. repeat steps 2 and 3 for M times, where M=the number of self-test sequences needed to achieve the desired level of test. When M self-test sequences are completed, use the scan procedure to scan out the ASIC and verify the MISR signature; and
5. write bit 164=0 (enter scan mode).

Restore Procedure
1. write bit 136=0 (lower CCLK);
2. write bit 138=0 (lower BCLK);
3. write bit 162=0 (select ASIC functional clock);
4. write bit 164=0 (exit self-test mode); and
5. write bit 168=0 (restart clock).

Figure 13:
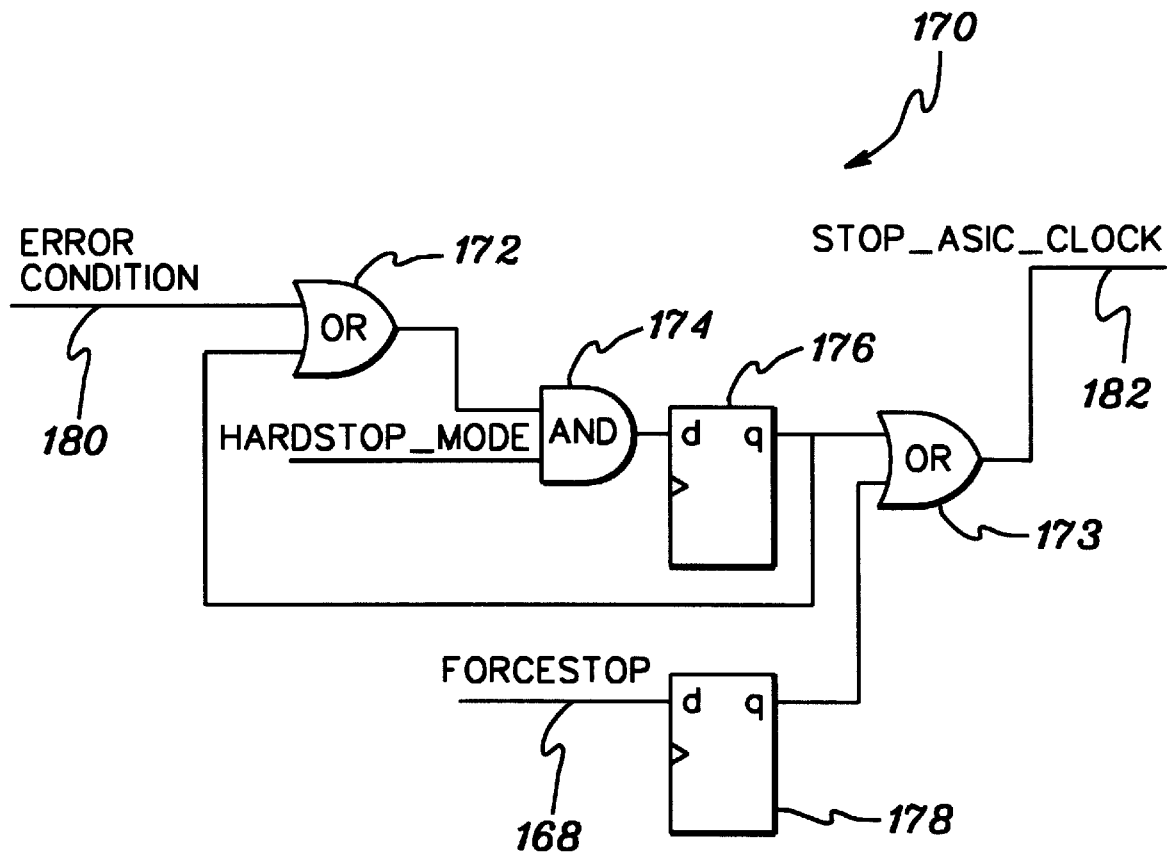
FIG. 13 depicts logic within the FPGA of FIG. 2 useful in debugging errors occurring in the ASIC of FIG. 2.

Another feature of the read scan procedure is the ability to assist in functional debugging. FIG. 13 depicts logic 170, which FPGA 28 is configured to have, to allow the ASIC clocks to be hard stopped upon the detection of an error condition during normal ASIC operation. If the clocks are hard stopped, the ASIC registers in the stumps channels can be scanned out and logged for error determination. The hard stop is accomplished by writing hardstop_mode bit 166 in POS register 132 to be a 1. While the ASIC is performing its normal logic functions and an error is detected, the ASIC clocks are hard stopped. The contents of the ASIC registers can then be scanned out for error determination.

Logic 170 comprises OR gates 172 and 173, AND gate 174, and flip-flops 176 and 178. When an error condition signal on line 180 is raised, and bit 166 of POS register 132 is set high, the ASIC clocks will be stopped via a stop_asic_clock signal over line 182. The ASIC clocks will also be stopped whenever bit 168 of POS register 132 is set high.

Another advantage of the present invention is that after testing is complete, the reconfigurable logic (FPGA 28) can be reconfigured for post-testing adapter card functions.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. Apparatus for testing an application specific integrated circuit (ASIC) on an adapter card in a computer system, wherein the ASIC has at least one logic function, the apparatus comprising:

reconfigurable logic coupled to the ASIC and residing on the adapter card for causing data to be provided to the ASIC;

means residing on the adapter card for operating on the data with the at least one logic function to produce output data; and means for determining whether there are any errors in the output data.

2. The apparatus of claim 1, wherein the reconfigurable logic causes random data to be provided to the ASIC.

3. The apparatus of claim 1, wherein the ASIC comprises a plurality of internal registers, and wherein the reconfigurable logic causes the data to be written to the plurality of internal registers.

4. The apparatus of claim 3, wherein the means for operating comprises means for storing the output data in the plurality of internal registers.

5. The apparatus of claim 1, wherein the means for determining comprises means for operating on the output data to produce a signature.

6. The apparatus of claim 5, wherein the means for operating on the output data comprises a multiple input shift register.

7. The apparatus of claim 1, further comprising means for placing the ASIC in a known initial state prior to providing the data.

8. The apparatus of claim 7, wherein the ASIC comprises at least one clock, and wherein the means for placing comprises means for stopping the at least one clock prior to providing the data.

9. The apparatus of claim 8, wherein the means for placing further comprises means for starting the at least one clock after providing the data to the ASIC.

10. The apparatus of claim 1, further comprising means for configuring the reconfigurable logic.

11. The apparatus of claim 10, wherein the reconfigurable logic comprises a field programmable gate array (FPGA), and wherein the configuring means comprises means for configuring the FPGA.

12. The apparatus of claim 11, wherein the means for configuring the FPGA comprises one or more programmable options select registers residing on the adapter card and coupled to the FPGA.

* * * * *